United States Patent
Li (10) Patent No.: US 10,710,350 B2
(45) Date of Patent: Jul. 14, 2020

(54) NANOMETER WIRE GRID STRUCTURE FABRICATION METHOD

(71) Applicant: Shenzhen China Star Optoelectronics Technology Co., Ltd., Shenzhen (CN)

(72) Inventor: Minghui Li, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 159 days.

(21) Appl. No.: 15/559,425

(22) PCT Filed: Jun. 20, 2017

(86) PCT No.: PCT/CN2017/089261
§ 371 (c)(1),
(2) Date: Sep. 19, 2017

(87) PCT Pub. No.: WO2018/214202
PCT Pub. Date: Nov. 29, 2018

(65) Prior Publication Data
US 2018/0339501 A1    Nov. 29, 2018

(30) Foreign Application Priority Data
May 23, 2017    (CN) .......................... 2017 1 0369879

(51) Int. Cl.
*B32B 37/00* (2006.01)
*B32B 3/10* (2006.01)
(Continued)

(52) U.S. Cl.
CPC .............. *B32B 37/025* (2013.01); *B32B 3/10* (2013.01); *B32B 15/08* (2013.01); *G02B 5/3058* (2013.01);
(Continued)

(58) Field of Classification Search
CPC ... B32B 37/025; G02B 5/3058; G03F 7/0002; B44C 1/14; B29C 66/223
(Continued)

(56) References Cited

U.S. PATENT DOCUMENTS 8,263,194 B2    9/2012   Chen
2004/0121568 A1* 6/2004   Kim .................... H01L 51/0004
                                                438/584
(Continued)

FOREIGN PATENT DOCUMENTS

CN    101159179 A    4/2008
CN    102308234 A    1/2012
(Continued)

OTHER PUBLICATIONS

Machine Translation of KR 20080040904 date unknown.*
Certified copy of priority document CN 201710369879.0 May 23, 2017 (filing date).*

*Primary Examiner* — John L Goff, II
(74) *Attorney, Agent, or Firm* — Leong C. Lei (57) ABSTRACT

The present invention provides a nanometer wire grid structure fabrication method. The method first uses an imprinting mold to subject a thermoplastic base plate to hot pressing so as to form a plurality of recesses and a plurality of projections that are alternate with each other thereon, and then forms a metal film on the plurality of recesses and the plurality of projections, then uses a metal bonding adhesive material to transfer portions of the metal film located on the projections to a wire grid carrier board, and finally peeling off the thermoplastic base plate to obtain a nanometer wire grid structure, and compared to the prior art, the entire process is conducted in a manner of being free of photoresist coating, photoresist residue, and metal etching, so as to avoid problems of fabrication of the prior art caused by poor etching accuracy, difficulty of photoresist residue removal,
(Continued)

and wire grid collapsing during etching operation and help simplify the fabrication process of a nanometer wire grid structure, shorten fabrication time of the nanometer wire grid structure, and improve fabrication efficiency and process yield of the nanometer wire grid structure.

12 Claims, 5 Drawing Sheets

(51) Int. Cl.
 *B32B 15/08* (2006.01)
 *G02B 5/30* (2006.01)
 *G03F 7/00* (2006.01)
(52) U.S. Cl.
 CPC ........ *G03F 7/0002* (2013.01); *B32B 2250/02* (2013.01); *B32B 2307/42* (2013.01)

(58) Field of Classification Search
 USPC .................................................. 156/230–241
 See application file for complete search history.

(56) References Cited

U.S. PATENT DOCUMENTS

2010/0080914 A1* 4/2010 Forrest ................ H01L 51/0021
 427/259
2012/0133077 A1* 5/2012 Mizawa .................. B29C 33/56
 264/293

FOREIGN PATENT DOCUMENTS

| CN | 103828083 A | 5/2014 |
| CN | 106324742 A | 1/2017 |
| CN | 103842861 B | 3/2017 |
| JP | 4914012 B2 | 4/2012 |
| KR | 20080040904 A * | 5/2008 |

* cited by examiner

Fig. 11 providing a thermoplastic base plate and an imprinting mold and subjecting the thermoplastic base plate to hot pressing with the imprinting mold so as to form a plurality of recesses and a plurality of projections on a surface of the thermoplastic base plate and alternate with each other; — S1 separating the thermoplastic base plate from the imprinting mold and depositing a metal film on the surface of the thermoplastic base plate that is formed with the recesses and the projections; — S2 providing a wire grid carrier board and using a metal bonding adhesive material to transfer portions of the metal film from the projections to the wire grid carrier board; — S3 peeling off the thermoplastic base plate and portions of the metal film that are located in the recesses to form a nanometer wire grid structure. — S4

Fig. 12

NANOMETER WIRE GRID STRUCTURE FABRICATION METHOD

BACKGROUND OF THE INVENTION

1. Field of the Invention

The present invention relates to the field of display technology, and more particular to a nanometer wire grid structure fabrication method.

2. The Related Arts

Nano-Imprint Lithography (NIL) is a technique similar to high-molecule molding, which was proposed by Prof. Stephen Y. Chou of NanoStructure Lab of Princeton University, USA, in the 90s of the last century, in consideration of the traditional photolithographic techniques being limited by the wavelength of the exposure light used and already reaching the limits of fabrication of micro structures and thus incapable of producing an even smaller size. With such a technique, it is possible to produce a structure unit having a size smaller than 10 nm on a semiconductor silicon wafer.

Since being proposed in 1995, nano-imprint lithography has been developed for more than 14 years and has been diversified into various imprinting techniques that have been widely used in multiple fields, including semiconductor fabrication, micro-electro-mechanical systems (MEMSs), bischips, and biomedicine, and is honored as the ten greatest techniques that change human beings. The nano-imprint lithography is different from the traditional photolithography in that the nano-imprint lithography directly transfers a pattern from a mold to a backing so as to achieve the purpose of mass production. The nano-imprint lithography has various advantages, including easy operation, high resolution, high productivity, and low cost. The basic idea of NIL is to transfer a pattern to a corresponding backing through a template and a medium for transfer is often a very thin polymer film, which is subjected to treatment, such as hot pressing or irradiation, to have the structure thereof cured and hardened so as to preserve the transferred pattern. The entire process includes two operations that are imprinting and pattern transfer.

With the development of the nano-imprint lithography, people have started to manufacture nanometer wire grid structures to replace the traditional polarizers for providing a polarization effect on light within the wavelength range of visible light. The so-call nanometer wire grid structure is an optical grating having a grating period that is smaller than the wavelength of incident light. The nanometer wire grid structure shows a high extinction ratio for transverse magnetic (TM) and transverse electric (TE) type light fields and allow for significant transmission of TM light perpendicular to arranging direction of metal wires, while reflecting TE light parallel to the arranging direction of the metal wires, and can thus be used as a polarizer structure having a high transmission rate.

Specifically, referring to FIGS. 1-5, a fabrication process of a known nanometer wire grid structure comprises the following steps: Step 1, providing a base plate 100 and forming, in sequence, a metal film 200 and a photoresist film 300 on the base plate 100; Step 2, providing a imprinting mold 400 and using the imprinting mold 400 to carry out imprinting on the photoresist film 300; Step 3, separating the photoresist film 300 from the imprinting mold 400 to obtain a patterned photoresist layer 500; Step 4, using the photoresist layer 500 as shielding to subject the metal film 200 to etching so as to form a metal wire grid 201; and Step 5, removing the photoresist layer 500 to obtain a nanometer wire grid structure.

In the state of the art, considering wire width and height that are of nanometer order, the operations of removing photoresist and etching metal are extremely difficult. Thus, the nanometer wire grid structure fabricated with the above-described process suffers various problems, such as being easy to collapse, undesired residue of photoresist, and non-uniform etching of metal wires, which severely affect the performance of the wire grid in respect of polarization, and in addition, the fabrication cycle is long; the operation is complicated; and the efficiency is low.

SUMMARY OF THE INVENTION

An objective of the present invention is to provide a nanometer wire grid structure fabrication method that helps simplify a fabrication process of a nanometer wire grid structure, shortens the fabrication time of the nanometer wire grid structure, and increases the fabrication efficiency and process yield of the nanometer wire grid structure.

To achieve the above objective, the present invention provides a nanometer wire grid structure fabrication method, which comprises the following steps:

Step S1: providing a thermoplastic base plate and an imprinting mold and subjecting the thermoplastic base plate to hot pressing with the imprinting mold so as to form a plurality of recesses and a plurality of projections on a surface of the thermoplastic base plate and alternate with each other;

Step S2: separating the thermoplastic base plate from the imprinting mold and depositing a metal film on the surface of the thermoplastic base plate that is formed with the recesses and the projections;

Step S3: providing a wire grid carrier board and using a metal bonding adhesive material to transfer portions of the metal film from the projections to the wire grid carrier board; and Step S4: peeling off the thermoplastic base plate and portions of the metal film that are located in the recesses to form a nanometer wire grid structure.

The recesses have a depth that is greater than a thickness of the metal film.

The thermoplastic base plate is formed of a material comprising one of polyethylene, polypropylene, polystyrene, polymethyl methacrylate, polyvinyl chloride, nylon, polycarbonate, polyurethane, polytetrafluoroethylene, polyethylene terephthalate, thermoplastic polyimide, perfluoropolyether, polycarbonate, polypropylene, poly propylene glycol, cyclic olefin polymers, and siloxane.

The metal film is formed of material comprising one of aluminum, chromium, gold, silver, and nickel.

The wire grid carrier board comprises a rigid plate or a flexible plate.

The recesses and the projections are both in the form of elongate strips.

The nanometer wire grid structure has a wire width that is smaller than or equal to 200 nm.

The hot pressing is conducted in Step S1 at a temperature higher than temperatures at which the metal film transferring of Step S3 and the thermoplastic base plate peeling of Step S4 are conducted.

The present invention also provides a nanometer wire grid structure fabrication method, which comprises the following steps:

Step S1 providing a thermoplastic base plate and an imprinting mold and subjecting the thermoplastic base plate to hot pressing with the imprinting mold so as to form a plurality of recesses and a plurality of projections on a surface of the thermoplastic base plate and alternate with each other;

Step S2: separating the thermoplastic base plate from the imprinting mold and depositing a metal film on the surface of the thermoplastic base plate that is formed with the recesses and the projections;

Step S3: providing a wire grid carrier board and using a metal bonding adhesive material to transfer portions of the metal film from the projections to the wire grid carrier board; and Step S4: peeling off the thermoplastic base plate and portions of the metal film that are located in the recesses to form a nanometer wire grid structure;

wherein the recesses have a depth that is greater than a thickness of the metal film; and wherein the thermoplastic base plate is formed of a material comprising one of polyethylene, polypropylene, polystyrene, polymethyl methacrylate, polyvinyl chloride, nylon, polycarbonate, polyurethane, polytetrafluoroethylene, polyethylene terephthalate, thermoplastic polyimide, perfluoropolyether, polycarbonate, polypropylene, poly propylene glycol, cyclic olefin polymers, and siloxane.

The efficacy of the present invention is that the present invention provides a nanometer wire grid structure fabrication method. The method first uses an imprinting mold to subject a thermoplastic base plate to hot pressing so as to form a plurality of recesses and a plurality of projections that are alternate with each other thereon, and then forms a metal film on the plurality of recesses and the plurality of projections, then uses a metal bonding adhesive material to transfer portions of the metal film located on the projections to a wire grid carrier board, and finally peeling off the thermoplastic base plate to obtain a nanometer wire grid structure, and compared to the prior art, the entire process is conducted in a manner of being free of photoresist coating, photoresist residue, and metal etching, so as to avoid problems of fabrication of the prior art caused by poor etching accuracy, difficulty of photoresist residue removal, and wire grid collapsing during etching operation and help simplify the fabrication process of a nanometer wire grid structure, shorten fabrication time of the nanometer wire grid structure, and improve fabrication efficiency and process yield of the nanometer wire grid structure.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTOIN OF THE PREFERRED EMBODIMENTS

To further expound the technical solution adopted in the present invention and the advantages thereof, a detailed description will be given with reference to the preferred embodiments of the present invention and the drawings thereof.

Figure 1:
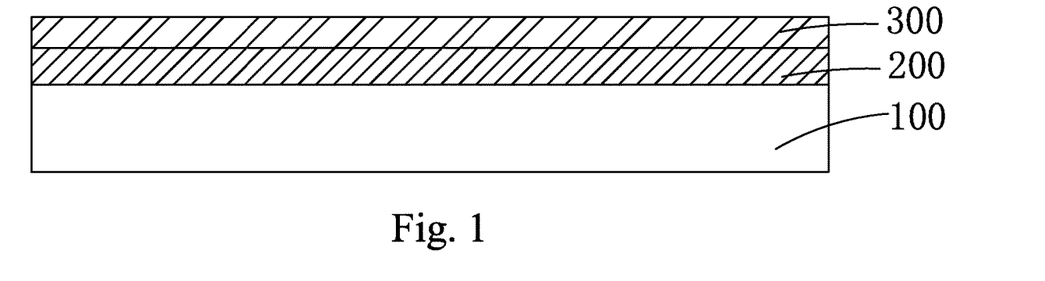
FIG. 1 is a schematic view illustrating Step 1 of a known manufacturing process of a nanometer wire grid structure.
Figure 2:
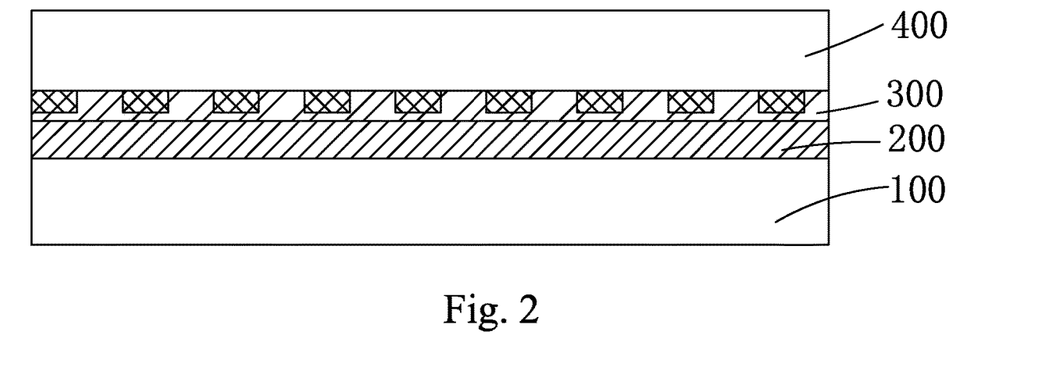
FIG. 2 is a schematic view illustrating Step 2 of the known manufacturing process of a nanometer wire grid structure.
Figure 3:
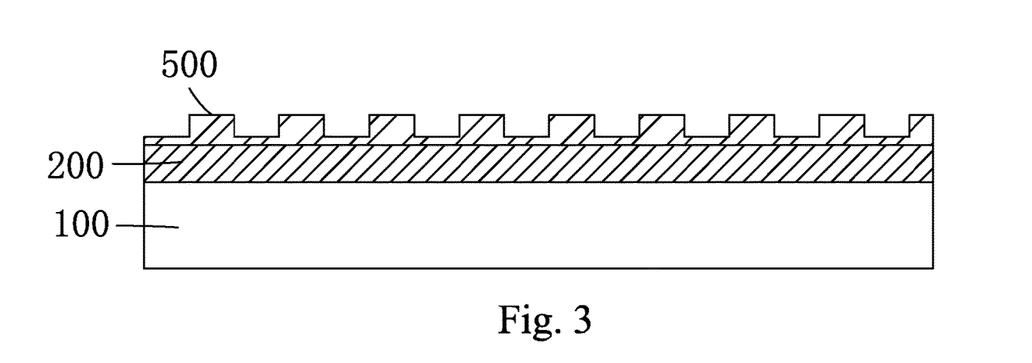
FIG. 3 is a schematic view illustrating Step 3 of the known manufacturing process of a nanometer wire grid structure.
Figure 4:
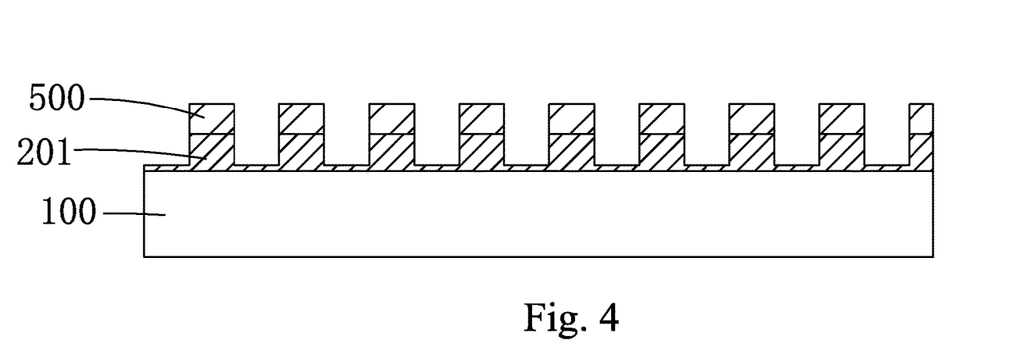
FIG. 4 is a schematic view illustrating Step 4 of the known manufacturing process of a nanometer wire grid structure.
Figure 5:
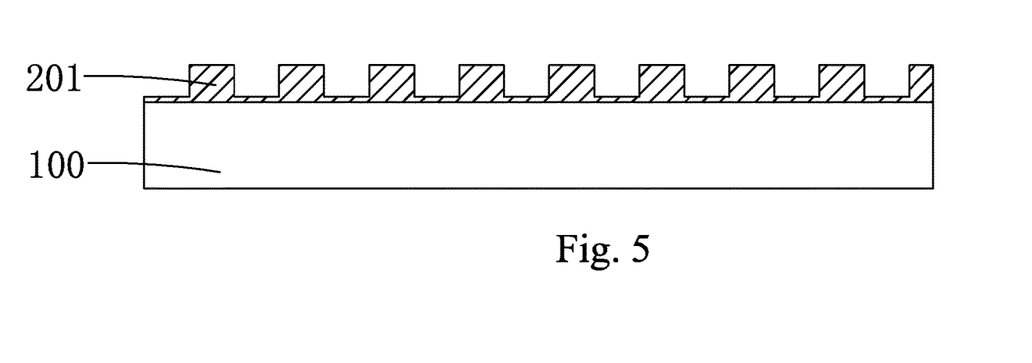
FIG. 5 is a schematic view illustrating Step 5 of the known manufacturing process of a nanometer wire grid structure.
Figure 6:
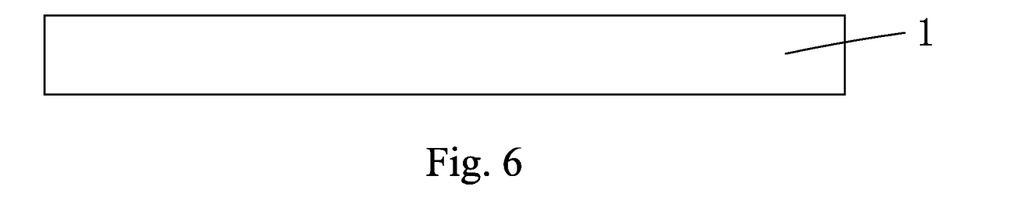
FIGS. 6 and 7 are schematic views illustrating Step S1 of a nanometer wire grid fabrication method according to the present invention.
Figure 7:
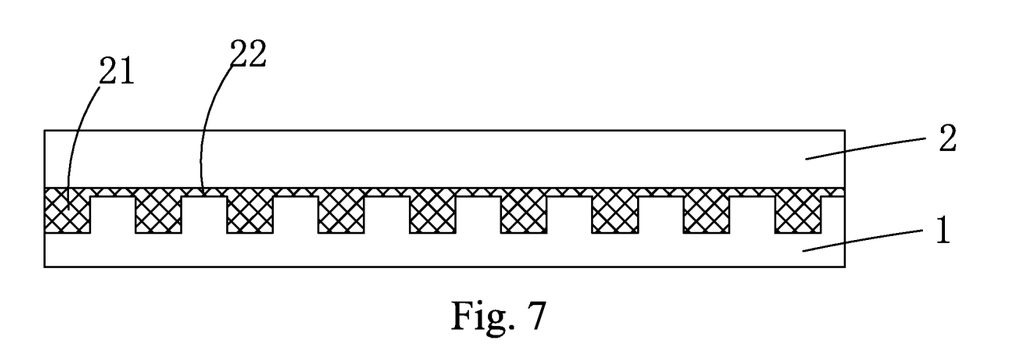
Figure 12:
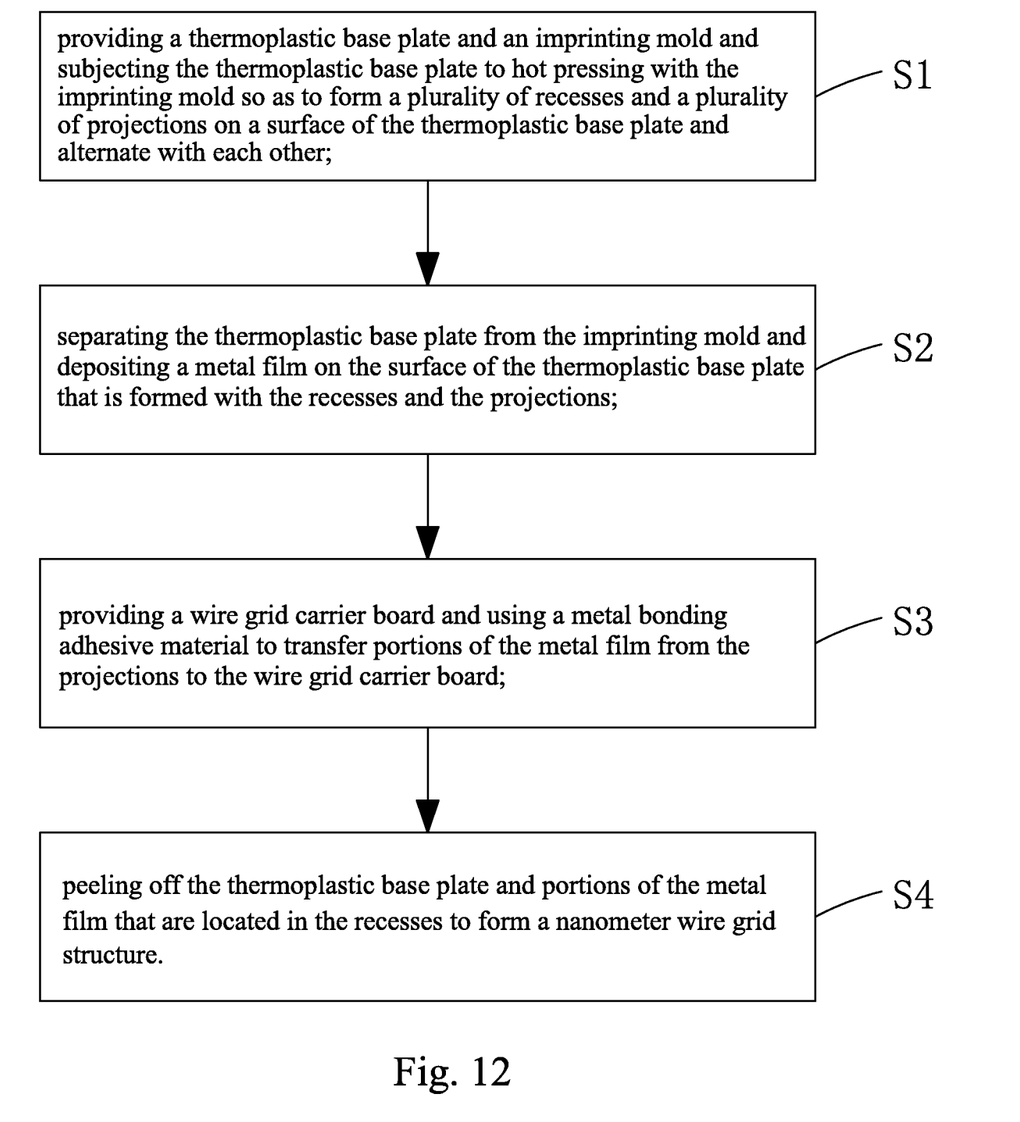
FIG. 12 is a flow chart illustrating the nanometer wire grid structure fabrication method according to the present invention.

Referring to FIG. 12, the present invention provides a nanometer wire grid structure fabrication method, which comprises the following steps:

Step S1: referring to FIGS. 6 and 7, providing a thermoplastic base plate 1 and an imprinting mold 2 and subjecting the thermoplastic base plate 1 to hot pressing with the imprinting mold 2 so as to form a plurality of recesses 11 and a plurality of projections 12 on a surface of the thermoplastic base plate 1 and alternate with each other.

Specifically, the thermoplastic base plate 1 is formed of a material comprising polyethylene (PE), polypropylene (PP), polystyrene (PS), polymethyl methacrylate (PMMA), polyvinyl chloride (PVC), nylon, polycarbonate (PC), polyurethane (PU), polytetrafluoroethylene (PTFE), polyethylene terephthalate (PET), thermoplastic polyimide (TPI), perfluoropolyether (PFPE), polycarbonate, polypropylene, poly propylene glycol, cyclic olefin polymers, or siloxane.

Further, for fabrication of a nanometer wire grid structure having a high aspect ratio (depth to width ratio), the thermoplastic base plate 1 is preferably formed of a perfluoropolyether material having a relatively low surface energy.

Specifically, the imprinting mold 2 has a surface that is formed with a plurality of recessed portions 22 and a plurality of raised portions 21 that are alternate with each other. By implementing hot pressing on the thermoplastic base plate 1 with the recessed portions 22 and the raised portions 21 of the imprinting mold 2 at a high temperature, the surface of the thermoplastic base plate 1 is formed, in a corresponding manner, a plurality of projections 12 and a plurality of recesses 11 that are alternate with each other. The projections 12 have a width that corresponds to wire width of a nanometer wire grid structure that will be subsequently formed. Preferably, the wire width of the nanometer wire grid structure is smaller than or equal to 200 nm.

Specifically, the recesses 11 and the projections 12 are both in the form of elongate strips in order to facilitation subsequent formation of the nanometer wire grid structure.

Figure 8:
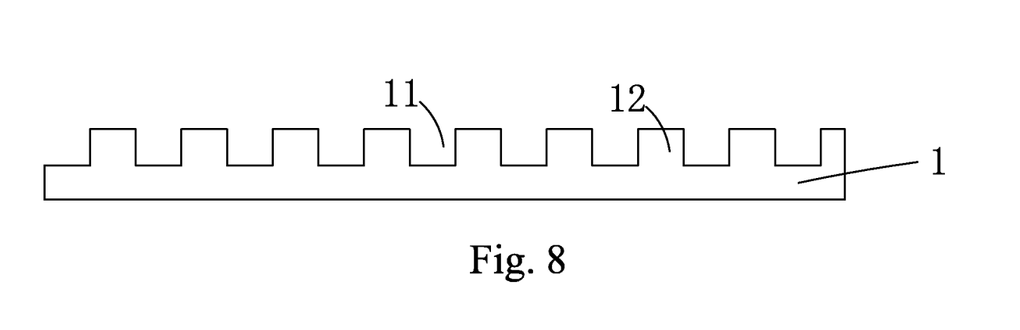
FIGS. 8 and 9 are schematic views illustrating Step S2 of the nanometer wire grid fabrication method according to the present invention.
Figure 9:
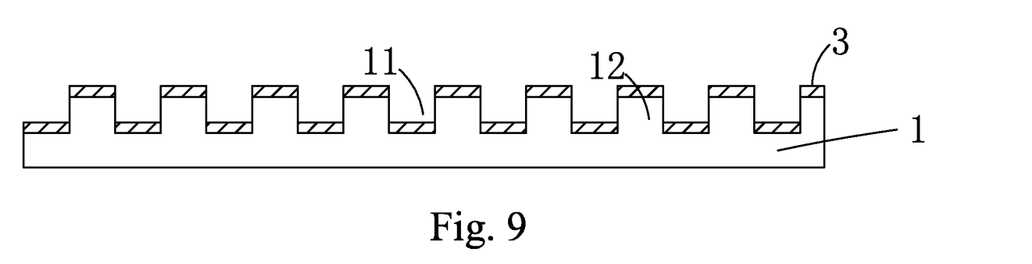

Step S2: referring to FIGS. 8 and 9, separating the thermoplastic base plate 1 from the imprinting mold 2 and depositing a metal film 3 on the surface of the thermoplastic base plate 1 that is formed with the recesses 11 and the projections 12.

Specifically, the metal film 3 is formed of a material comprising aluminum (Al), chromium (Cr), gold (Au), silver (Ag), or nickel (Ni).

Further, the recesses 11 have a depth that is greater than a thickness of the metal film 3 so that a step is formed when the metal film 3 is deposited in order to prevent portions of the metal film 3 located in the recesses 11 from being simultaneously transferred in a subsequent metal film transfer process.

Figure 10:
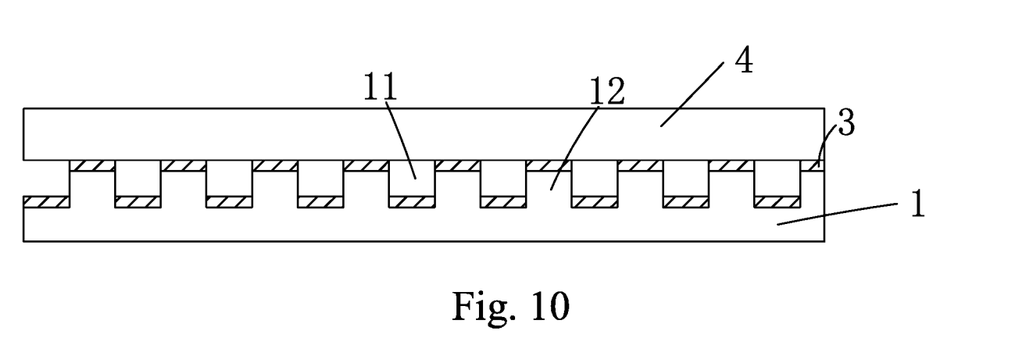
FIG. 10 is a schematic view illustrating Step S3 of the nanometer wire grid fabrication method according to the present invention.

Step S3: referring to FIG. 10, providing a wire grid carrier board 4 and using a metal bonding adhesive material to transfer portions of the metal film 3 from the projections 12 to the wire grid carrier board 4.

Specifically, the wire grid carrier board 4 can be a rigid plate, such as a glass plate, or may alternatively be a flexible plate, such as a polyimide plate. The selection can be made according to practical needs.

Figure 11:
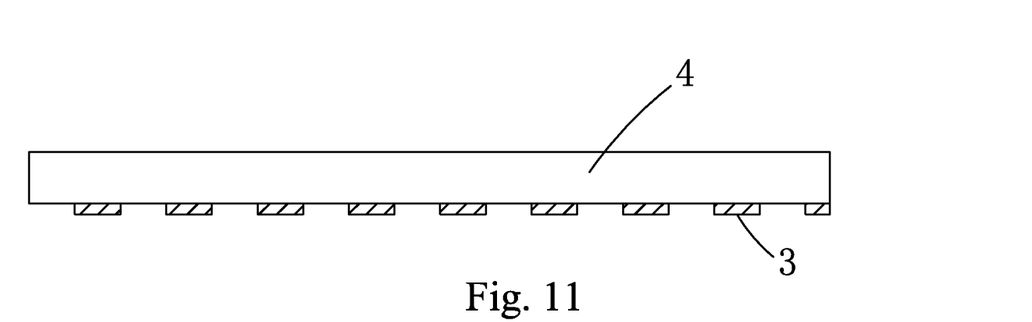
FIG. 11 is a schematic view illustrating Step S4 of the nanometer wire grid fabrication method according to the present invention.

Step S4: referring to FIG. 11, peeling off the thermoplastic base plate 1 and portions of the metal film 3 that are located in the recesses 11 to form a nanometer wire grid structure.

Specifically, compared to the high-temperature hot pressing process of Step S1, in the process of Step S3 where a metal bonding adhesive material is used to remove the metal film 3 from the projections 12 and transfer to the wire grid carrier board 4 and the process of Step S4 where the thermoplastic base plate 1 and portions of the metal film 3 located in the recesses 11 are peeled off are conducted in low temperatures. In other words, hot pressing conducted in Step S1 is carried out at a temperature higher than temperatures at which transfer of the metal film 3 conducted in Step S3 and peeling the thermoplastic base plate 1 conducted in Step S4 are carried out so that an effect of thermal expansion (and cold contraction) of the thermoplastic base plate 1 can be used to effectively ensure the results of hot pressing and peeling of the thermoplastic base plate 1, ensure success rate of fabrication of the nanometer wire grid structure and avoiding damage of the shape of the nanometer wire grid structure.

It is important that compared to the prior art, the nanometer wire grid structure fabrication method provided in this invention is completely free of photoresist coating, photoresist residue, and metal etching, so as to avoid problems of fabrication of the prior art caused by poor etching accuracy, difficulty of photoresist residue removal, and wire grid collapsing during etching operation and help simplify the fabrication process of a nanometer wire grid structure, shorten fabrication time of the nanometer wire grid structure, and improve fabrication efficiency and process yield of the nanometer wire grid structure.

In summary, the present invention provides a nanometer wire grid structure fabrication method. The method first uses an imprinting mold to subject a thermoplastic base plate to hot pressing so as to form a plurality of recesses and a plurality of projections that are alternate with each other thereon, and then forms a metal film on the plurality of recesses and the plurality of projections, then uses a metal bonding adhesive material to transfer portions of the metal film located on the projections to a wire grid carrier board, and finally peeling off the thermoplastic base plate to obtain a nanometer wire grid structure, and compared to the prior art, the entire process is conducted in a manner of being free of photoresist coating, photoresist residue, and metal etching, so as to avoid problems of fabrication of the prior art caused by poor etching accuracy, difficulty of photoresist residue removal, and wire grid collapsing during etching operation and help simplify the fabrication process of a nanometer wire grid structure, shorten fabrication time of the nanometer wire grid structure, and improve fabrication efficiency and process yield of the nanometer wire grid structure.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A nanometer wire grid structure fabrication method, comprising the following steps:
   Step S1: providing a thermoplastic base plate and an imprinting mold and subjecting the thermoplastic base plate to a hot pressing operation with the imprinting mold so as to form a plurality of recesses and a plurality of projections on a surface of the thermoplastic base plate and alternate with each other, wherein the imprinting mold has a surface that is formed with a plurality of recessed portions and a plurality of raised portions that are alternate with each other, and the hot pressing operation is such that the plurality of projections of the thermoplastic base plate are respectively and directly defined by the plurality of recessed portions of the imprinting mold;
   Step S2: separating the thermoplastic base plate from the imprinting mold and depositing a metal film on the surface of the thermoplastic base plate that is formed with the recesses and the projections;
   Step S3: providing a wire grid carrier board and using a metal bonding adhesive material to transfer portions of the metal film from the projections to the wire grid carrier board; and
   Step S4: peeling off the thermoplastic base plate and portions of the metal film that are located in the recesses to form a nanometer wire grid structure, wherein the nanometer wire grid structure comprises the portions of the metal film that are transferred from the projections of the thermoplastic base plate that are respectively and directly defined by the recessed portions of the imprinting mold;
   wherein the hot pressing is conducted in Step S1 at a temperature higher than temperatures at which the metal film transferring of Step S3 and the thermoplastic base plate peeling of Step S4 are conducted, such that the thermoplastic base plate undergoes a process of thermal expansion and cold contraction caused by a temperature variation from Step S1 to Steps S3 and S4.

2. The nanometer wire grid structure fabrication method as claimed in claim 1, wherein the recesses have a depth that is greater than a thickness of the metal film.

3. The nanometer wire grid structure fabrication method as claimed in claim 1, wherein the thermoplastic base plate is formed of a material comprising one of polyethylene, polypropylene, polystyrene, polymethyl methacrylate, polyvinyl chloride, nylon, polycarbonate, polyurethane, polytetrafluoroethylene, polyethylene terephthalate, thermoplastic polyimide, perfluoropolyether, polycarbonate, poly propylene glycol, cyclic olefin polymers, and siloxane.

4. The nanometer wire grid structure fabrication method as claimed in claim 1, wherein the metal film is formed of material comprising one of aluminum, chromium, gold, silver, and nickel.

5. The nanometer wire grid structure fabrication method as claimed in claim 1, wherein the wire grid carrier board comprises a rigid plate or a flexible plate.

6. The nanometer wire grid structure fabrication method as claimed in claim 1, wherein the recesses and the projections are both in the form of elongate strips.

7. The nanometer wire grid structure fabrication method as claimed in claim 1, wherein the nanometer wire grid structure has a wire width that is smaller than or equal to 200 nm.

8. A nanometer wire grid structure fabrication method, comprising the following steps:
- Step S1: providing a thermoplastic base plate and an imprinting mold and subjecting the thermoplastic base plate to a hot pressing operation with the imprinting mold so as to form a plurality of recesses and a plurality of projections on a surface of the thermoplastic base plate and alternate with each other, wherein the imprinting mold has a surface that is formed with a plurality of recessed portions and a plurality of raised portions that are alternate with each other, and the hot pressing operation is such that the plurality of projections of the thermoplastic base plate are respectively and directly defined by the plurality of recessed portions of the imprinting mold;
- Step S2: separating the thermoplastic base plate from the imprinting mold and depositing a metal film on the surface of the thermoplastic base plate that is formed with the recesses and the projections;
- Step S3: providing a wire grid carrier board and using a metal bonding adhesive material to transfer portions of the metal film from the projections to the wire grid carrier board; and
- Step S4: peeling off the thermoplastic base plate and portions of the metal film that are located in the recesses to form a nanometer wire grid structure, wherein the nanometer wire grid structure comprises the portions of the metal film that are transferred from the projections of the thermoplastic base plate that are respectively and directly defined by the recessed portions of the imprinting mold;
- wherein the recesses have a depth that is greater than a thickness of the metal film;
- wherein the thermoplastic base plate is formed of a material comprising one of polyethylene, polypropylene, polystyrene, polymethyl methacrylate, polyvinyl chloride, nylon, polycarbonate, polyurethane, polytetrafluoroethylene, polyethylene terephthalate, thermoplastic polyimide, perfluoropolyether, polycarbonate, poly propylene glycol, cyclic olefin polymers, and siloxane; and
- wherein the hot pressing is conducted in Step S1 at a temperature higher than temperatures at which the metal film transferring of Step S3 and the thermoplastic base plate peeling of Step S4 are conducted, such that the thermoplastic base plate undergoes a process of thermal expansion and cold contraction caused by a temperature variation from Step S1 to Steps S3 and S4.

9. The nanometer wire grid structure fabrication method as claimed in claim 8, wherein the metal film is formed of material comprising one of aluminum, chromium, gold, silver, and nickel.

10. The nanometer wire grid structure fabrication method as claimed in claim 8, wherein the wire grid carrier board comprises a rigid plate or a flexible plate.

11. The nanometer wire grid structure fabrication method as claimed in claim 8, wherein the recesses and the projections are both in the form of elongate strips.

12. The nanometer wire grid structure fabrication method as claimed in claim 8, wherein the nanometer wire grid structure has a wire width that is smaller than or equal to 200 nm.

\* \* \* \* \*